United States Patent
Doyle et al.

(10) Patent No.: US 6,914,487 B1
(45) Date of Patent: Jul. 5, 2005

(54) METHOD AND SYSTEM FOR PROVIDING POWER MANAGEMENT IN A RADIO FREQUENCY POWER AMPLIFIER USING ADAPTIVE ENVELOPE TRACKING

(75) Inventors: James T. Doyle, Nederland, CO (US); Dragan Maksimovic, Boulder, CO (US); Yushan Li, Longmont, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/417,566

(22) Filed: Apr. 17, 2003

Related U.S. Application Data

(60) Provisional application No. 60/373,860, filed on Apr. 19, 2002.

(51) Int. Cl.[7] ................................................. H03F 3/04
(52) U.S. Cl. ....................................... 330/297; 330/129
(58) Field of Search ................................ 330/297, 129, 330/136, 298, 285, 296, 207 P

(56) References Cited

U.S. PATENT DOCUMENTS

| | | | | |
|---|---|---|---|---|
| 3,900,823 A | * | 8/1975 | Sokal et al. | 330/149 |
| 5,847,602 A | * | 12/1998 | Su | 330/10 |
| 6,084,468 A | * | 7/2000 | Sigmon et al. | 330/136 |
| 6,373,340 B1 | * | 4/2002 | Shashoua | 330/297 |
| 6,646,501 B1 | * | 11/2003 | Wessel | 330/10 |
| 6,646,511 B2 | * | 11/2003 | Canyon et al. | 330/297 |

* cited by examiner

Primary Examiner—Henry Choe

(57) ABSTRACT

A method for providing power management in a radio frequency power amplifier using adaptive envelope tracking is provided that includes receiving an input voltage. A power control signal is received. A feedback signal is received. An amplifier input signal is received. From the input voltage, a regulated power supply signal is generated based on the power control signal, the feedback signal, and the amplifier input signal.

25 Claims, 7 Drawing Sheets

US 6,914,487 B1

METHOD AND SYSTEM FOR PROVIDING POWER MANAGEMENT IN A RADIO FREQUENCY POWER AMPLIFIER USING ADAPTIVE ENVELOPE TRACKING

CROSS-REFERENCE TO RELATED APPLICATIONS

This application is related to co-pending U.S. application Ser. No. 10/160,281, entitled "Method and System for Providing Power Management in a Radio Frequency Power Amplifier by Dynamically Adjusting Supply and Bias Conditions" and claims the benefit of U.S. application Ser. No. 60/373,860 filed Apr. 19, 2002.

TECHNICAL FIELD OF THE INVENTION

The present invention relates generally to power amplifiers and, more particularly, to a method and system for providing power management in a radio frequency power amplifier using adaptive envelope tracking.

BACKGROUND OF THE INVENTION

Business and consumers use a wide array of wireless devices, including cell phones, wireless local area network (LAN) cards, global positioning system (GPS) devices, electronic organizers equipped with wireless modems, and the like. The increased demand for wireless communication, and other mobile, devices has created a corresponding demand for technical improvements to such devices. Generally speaking, more and more of the components of conventional radio receivers and transmitters are being fabricated in a single integrated circuit package.

One important aspect of wireless communication devices having integrated circuits is battery life. In order to maximize battery life for these wireless communication devices, much emphasis has been placed on minimizing power consumption in the integrated circuits of the wireless communication devices. One of the largest power consumers in a transmitter for a wireless communication device is the power amplifier. Thus, in order to minimize overall power consumption, a reduction in the power consumption of the power amplifier is often attempted.

Conventional approaches to minimizing power consumption in power amplifiers include envelope elimination and restoration (EER). This technique uses a high efficiency, non-linear power amplifier, such as a Class C power amplifier, instead of a low efficiency, linear power amplifier, such as a Class A power amplifier. However, if the power supply for the power amplifier is high frequency, such as 5 MHz or higher, instead of DC or low frequency, EER does not provide a workable solution.

Because many cellular telephone and other advanced signaling systems use higher order modulation with amplitude components in addition to phase components, linear power amplifiers are used in these systems. Thus, EER techniques may not be implemented to improve power amplifier efficiency in these systems. In addition, linear power amplifiers are generally even less efficient that non-linear power amplifiers. Therefore, a linear power amplifier efficiency improvement is needed that provides high bandwidth, in addition to high efficiency.

Discrete components, such as inductors and capacitors, of power amplifiers generally have to handle up to five times the desired tracking frequency for the power amplifier. However, typical discrete components are not specified for more than 1 MHz, and with pulse-width modulation techniques, the components need to handle up to 25 MHz for a 5 MHz tracking bandwidth. Thus, current technology does not provide components with the needed specifications to improve the efficiency of linear power amplifiers using conventional techniques.

SUMMARY OF THE INVENTION

In accordance with the present invention, a method and system for providing power management in a radio frequency power amplifier using adaptive envelope tracking are provided that substantially eliminate or reduce disadvantages and problems associated with conventional systems and methods. In particular, adaptive envelope tracking is used such that a switcher tracks low frequency components and an amplifier tracks high frequency components, isolating AC and DC components and allowing the most efficient circuit to do the tracking based on frequency.

According to one embodiment of the present invention, a method for providing power management in a radio frequency power amplifier using adaptive envelope tracking is provided. The method includes receiving an input voltage. A power control signal is received. A feedback signal is received. An amplifier input signal is received. From the input voltage, a regulated power supply signal is generated based on the power control signal, the feedback signal, and the amplifier input signal.

According to another embodiment of the present invention, a system for providing power management in a radio frequency power amplifier using adaptive envelope tracking is provided that includes a power amplifier and a power converter. The power amplifier is operable to generate a radio frequency output signal based on a radio frequency input signal. The power converter is coupled to the power amplifier. The power converter is operable to receive an input voltage, a power control signal, a feedback signal and an amplifier input signal. The power converter is also operable to generate from the input voltage a regulated power supply signal for the power amplifier based on the power control signal, the feedback signal, and the amplifier input signal.

Technical advantages of one or more embodiments of the present invention include providing an improved method for managing power consumption in mobile devices. In a particular embodiment, adaptive envelope tracking is used. As a result, a switcher tracks low frequency components, and an amplifier tracks high frequency components. Accordingly, AC and DC components are isolated and the most efficient circuit is allowed to do the tracking based on frequency.

Technical advantages of one or more embodiments of the present invention also include allowing one power amplifier to be used in GSM, GPRS (EDGE), and WCDMA applications and implementing a high frequency power supply to improve power amplifier efficiency. As a result, battery life of the mobile device is increased, a heat sink for the mobile device may be smaller or possibly eliminated, and the size of the mobile device may be reduced.

Other technical advantages will be readily apparent to one skilled in the art from the following figures, description, and claims.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 11, discussed below, and the various embodiments used to describe the principles of the present invention in this patent document are by way of illustration only and should riot be construed in any way to limit the scope of the invention. Those skilled in the art will understand that the principles of the present invention may be implemented in any suitably arranged power amplifier system.

Figure 1:
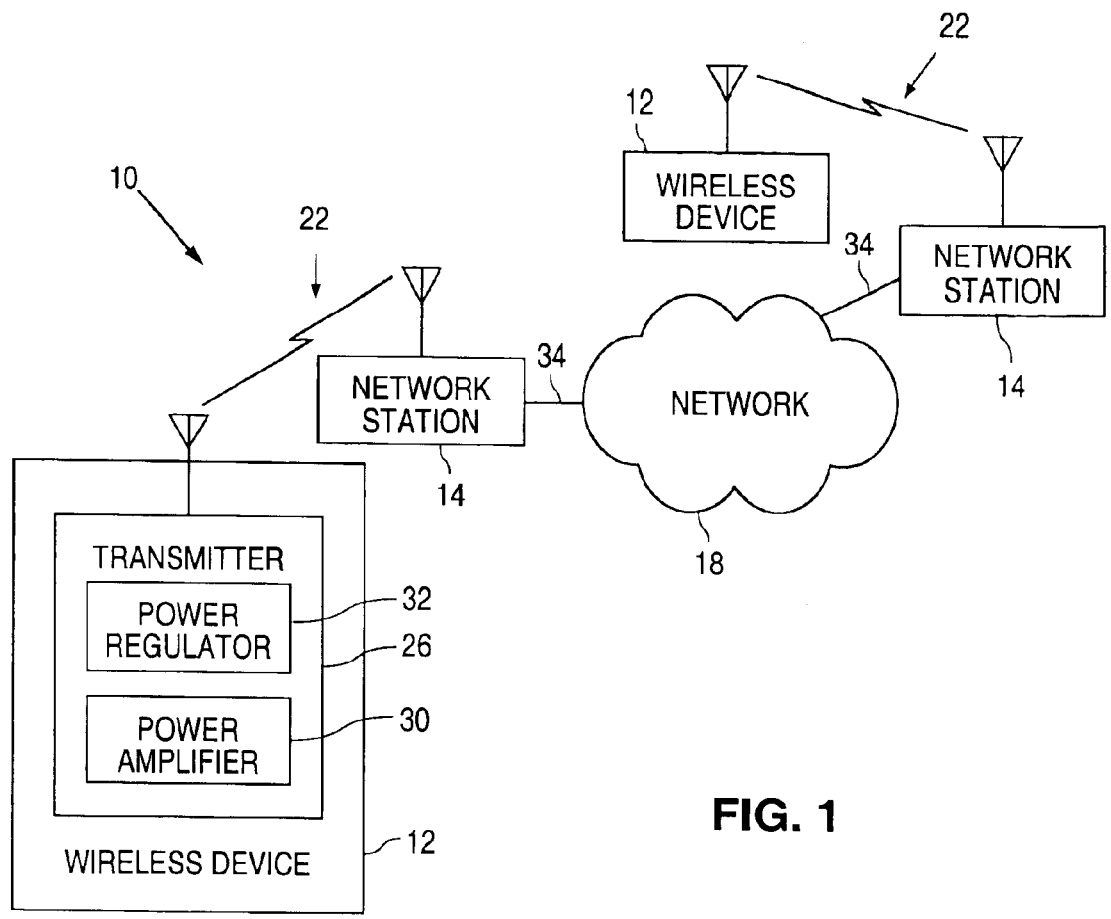
FIG. 1 is a block diagram illustrating a communication system operable to provide power management for a radio frequency power amplifier in accordance with one embodiment of the present invention.

FIG. 1 is a block diagram illustrating a communication system 10 operable to provide power management for a radio frequency power amplifier in accordance with one embodiment of the present invention. The communication system 10 comprises a plurality of wireless devices 12, a plurality of network stations 14 for providing communication for wireless devices 12 located in specified geographical areas, and a network 18 for providing communication between network stations 14 and other suitable communication system components, such as servers and the like, coupled to the network 18. Thus, it will be understood that the system 10 may comprise any other suitable components of a communication system, such as servers coupled to the network 18, without departing from the scope of the present invention.

Each wireless device 12 may comprise a cellular or other wireless telephone, a pager, a laptop computer, a personal digital assistant, or any other suitable type of wireless device operable to communicate wirelessly with the network 18 through a network station 14. As used herein, "each" means every one of at least a subset of the identified items.

Each wireless device 12 is operable to communicate with a network station 14 over a wireless interface 22. Thus, the wireless interface 22 is operable to transfer messages between a wireless device 12 and a network station 14. The wireless interface 22 may comprise communication channels defined upon radio links, such as an Enhanced Data for GSM (Global System for Mobile communications) Evolution interface, a Wideband Code Division Multiple Access interface, or any other suitable interface.

Each wireless device 12 comprises a transmitter 26, in addition to other suitable components to enable its operation that are not illustrated in FIG. 1. In accordance with the present invention, the transmitter 26 for at least one of the wireless devices 12 comprises a radio frequency power amplifier 30 and a power regulator 32. It will be understood that the transmitter 26 may also comprise any other suitable components for operation. The power amplifier 30 is operable to transmit a signal that includes data modulated onto a carrier such that the network station 14 may receive the signal over the wireless interface 22. The power regulator 32 is operable to regulate the power consumption of the power amplifier 30, as described in more detail below in connection with FIGS. 2–10.

Each network station 14 is operable to provide wireless devices 12 with access to voice and/or data networks by providing voice and/or data messages received from the wireless devices 12 to the network 18 and messages received from the network 18 to the wireless devices 12. According to one embodiment, the network stations 14 comprise base stations for a public land mobile network and the wireless devices 12 comprise wireless telephones.

In one embodiment, the network 18 comprises a packet data network, such as the Internet, or other suitable network. However, the network 18 may also comprise any interconnection found on any computer network such as a local area network (LAN), a wide area network (WAN), or any other communications and data exchange systems created by connecting two or more computers.

Each network station is operable to communicate with the network 18 over communication lines 34, which may be any type of communication link capable of supporting data transfer. In one embodiment, the communication lines 34 may comprise, alone or in combination, Integrated Services Digital Network (ISDN), Asymmetric Digital Subscriber Line (ADSL), T1 or T3 communication lines, hardwire lines, or telephone links. It will be understood that the communication lines 34 may comprise other suitable types of data communication links. The communication lines 34 may also connect to a plurality of intermediate servers between the network 18 and the network stations 14.

Figure 2A:
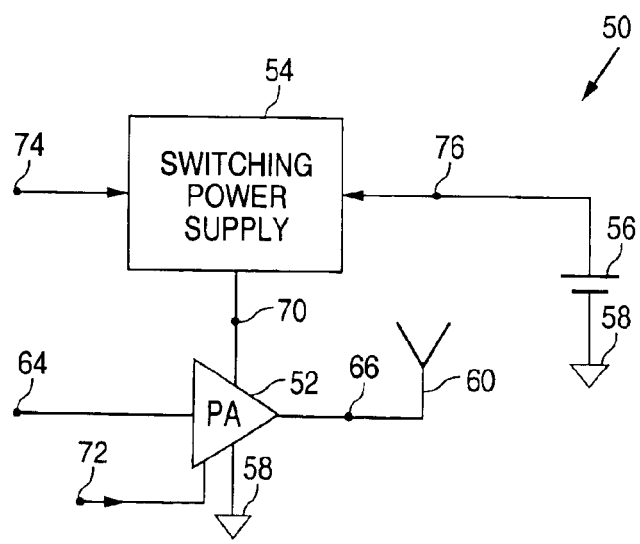
FIG. 2A is a block diagram illustrating the transmitter of FIG. 1 in accordance with one embodiment of the present invention.

FIG. 2A is a block diagram illustrating a transmitter 50 in accordance with one embodiment of the present invention. The transmitter 50 may be used as the transmitter 26 in the wireless device 12 of the communication system 10; however, it will be understood that the transmitter 50 may be implemented in any suitable component or system other than the communication system without departing from the scope of the present invention.

The transmitter 50 comprises a power amplifier 52, a power regulator 54, and a power source 56. The power regulator 54 is coupled between the power source 56 and the power amplifier 52. The power amplifier 52 and the power source 56 are also coupled to ground 58.

The power amplifier 52 comprises a radio frequency power amplifier and is operable to generate a radio frequency signal that includes data modulated onto a carrier for transmission over a wireless interface, such as the wireless interface 22. According to one embodiment, the power amplifier 52 comprises a Class A amplifier. However, it will be understood that the power amplifier 52 may comprise any suitable type of power amplifier without departing from the scope of the present invention.

The power regulator 54 comprises a switching power supply and is operable to receive a specified voltage from the power source 56 and to provide a regulated power supply to the power amplifier 52 based on the voltage received from the power source 56.

According to one embodiment, the power source 56 comprises a battery operable to provide a voltage of between 2.7 and 5.5 volts. However, it will be understood that the power source 56 may provide any suitable voltage without departing from the scope of the present invention. The ground 58 is operable to provide any suitable potential less than the power source 56. According to one embodiment, the ground 58 is operable to provide a potential of approximately 0 volts.

The transmitter 50 also comprises an antenna 60 coupled to the power amplifier 52. The antenna 60 is operable to receive the radio frequency signal generated by the power amplifier 52 and to transmit the signal over the wireless interface.

In operation, the power amplifier 52 receives a radio frequency input signal 64 and generates a radio frequency output signal 66 based on the input signal 64. The output signal 66 is provided to the antenna 60 for transmission over the wireless interface. The power amplifier 52 operates based on a regulated power supply signal 70 generated by the power regulator 54.

In addition, the power amplifier 52 receives a bias signal 72. The bias signal 72 may be provided based on a look-up table or other suitable means in order to optimize the efficiency of the power amplifier 52 based on operating conditions.

The power regulator 54 receives a power control signal 74 and the input voltage 76 supplied by the power source 56. Based on the power control signal 74, the power regulator 54 generates the regulated power supply signal 70 for the power amplifier 52 from the input voltage 76. According to one embodiment, the power regulator 54 scales the regulated power supply signal 70 with the output power level of the output signal 66.

Figure 2B:
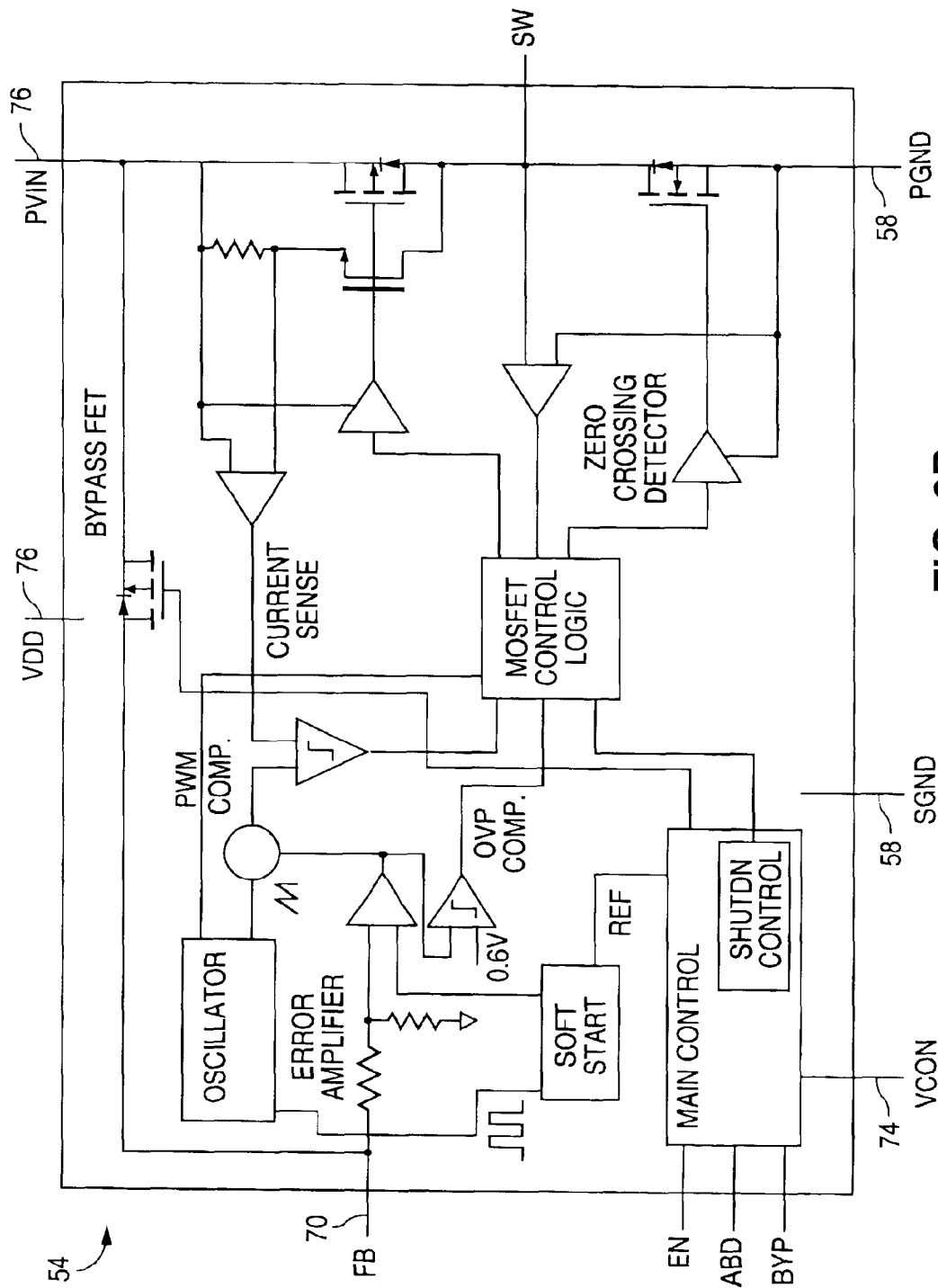
FIG. 2B is a block diagram illustrating the power regulator of FIG. 2A in accordance with one embodiment of the present invention.

FIG. 2B is a block diagram illustrating the power regulator 54 in accordance with one embodiment of the present invention. It will be understood that the power regulator 54 may be otherwise suitably implemented without departing from the scope of the present invention.

The power regulator 54 comprises a switching power supply that is operable to receive the power control signal 74 and the input voltage 76 from the power source 56 and to generate the regulated power supply signal 70 for the power amplifier 52 based on those signals 74 and 76. The power regulator 54 comprises control logic, a controller including shutdown control, a soft start system, an oscillator, two comparators, an error amplifier, a current sensor, and a zero crossing detector, in addition to a plurality of other circuit components, such as resistors, transistors and inverters.

Figure 3:
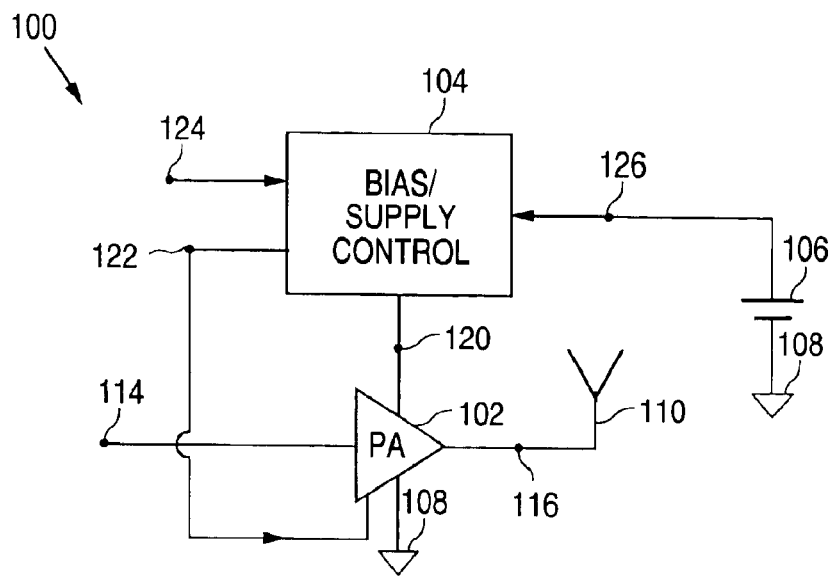
FIG. 3 is a block diagram illustrating the transmitter of FIG. 1 in accordance with a second embodiment of the present invention.

FIG. 3 is a block diagram illustrating a transmitter 100 in accordance with one embodiment of the present invention. The transmitter 100 may be used as the transmitter 26 in the wireless device 12 of the communication system 10; however, it will be understood that the transmitter 100 may be implemented in any suitable component or system other than the communication system without departing from the scope of the present invention.

The transmitter 100 comprises a power amplifier 102, a power regulator 104, and a power source 106. The power regulator 104 is coupled between the power source 106 and the power amplifier 102. The power amplifier 102 and the power source 106 are also coupled to ground 108.

The power amplifier 102 comprises a radio frequency power amplifier and is operable to generate a radio frequency signal that includes data modulated onto a carrier for transmission over a wireless interface, such as the wireless interface 22. The power regulator 104 comprises an integrated bias/supply control and is operable to receive a specified voltage from the power source 106 and to provide a regulated power supply to the power amplifier 102 based on the voltage received from the power source 106.

According to one embodiment, the power source 106 comprises a battery operable to provide a voltage of between 2.7 and 5.5 volts. However, it will be understood that the power source 106 may provide any suitable voltage without departing from the scope of the present invention. The ground 108 is operable to provide any suitable potential less than the power source 106. According to one embodiment, the ground 108 is operable to provide a potential of approximately 0 volts.

The transmitter 100 also comprises an antenna 110 coupled to the power amplifier 102. The antenna 110 is operable to receive the radio frequency signal generated by the power amplifier 102 and to transmit the signal over the wireless interface.

In operation, the power amplifier 102 receives a radio frequency input signal 114 and generates a radio frequency output signal 116 based on the input signal 114. The output signal 116 is provided to the antenna 110 for transmission over the wireless interface. The power amplifier 102 operates based on a regulated power supply signal 120 generated by the power regulator 104.

In addition, the power amplifier 102 receives a bias signal 122 from the power regulator 104. The bias signal 122 may be provided based on a look-up table or other suitable means in order to optimize the efficiency of the power amplifier 102 based on operating conditions.

The power regulator 104 receives a power control signal 124 and the input voltage 126 supplied by the power source 106. Based on the power control signal 124, the power regulator 104 generates the regulated power supply signal 120 for the power amplifier 102 from the input voltage 126. According to one embodiment, the power regulator 104 optimizes the efficiency of the power amplifier 102 over a full range of output power levels for the output signal 116 in both GSM and WCDMA.

Figure 4:
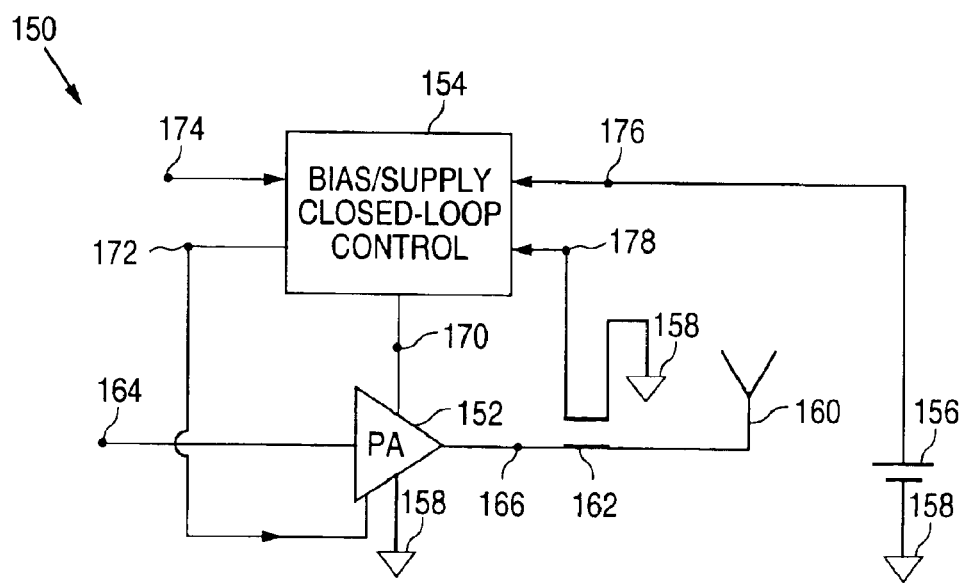
FIG. 4 is a block diagram illustrating the transmitter of FIG. 1 in accordance with a third embodiment of the present invention.

FIG. 4 is a block diagram illustrating a transmitter 150 in accordance with one embodiment of the present invention. The transmitter 150 may be used as the transmitter 26 in the wireless device 12 of the communication system 10; however, it will be understood that the transmitter 150 may be implemented in any suitable component or system other than the communication system without departing from the scope of the present invention.

The transmitter 150 comprises a power amplifier 152, a power regulator 154, and a power source 156. The power regulator 154 is coupled between the power source 156 and the power amplifier 152. The power amplifier 152 and the power source 156 are also coupled to ground 158.

The power amplifier 152 comprises a radio frequency power amplifier and is operable to generate a radio frequency signal that includes data modulated onto a carrier for transmission over a wireless interface, such as the wireless interface 22. The power regulator 154 comprises an integrated bias/supply closed-loop control and is operable to receive a specified voltage from the power source 156 and to provide a regulated power supply to the power amplifier 152 based on the voltage received from the power source 156.

According to one embodiment, the power source 156 comprises a battery operable to provide a voltage of between 2.7 and 5.5 volts. However, it will be understood that the power source 156 may provide any suitable voltage without departing from the scope of the present invention. The ground 158 is operable to provide any suitable potential less than the power source 156. According to one embodiment, the ground 158 is operable to provide a potential of approximately 0 volts.

The transmitter 150 also comprises an antenna 160 coupled to the power amplifier 152 and a directional coupler 162. The antenna 160 is operable to receive the radio frequency signal generated by the power amplifier 152 and to transmit the signal over the wireless interface. The directional coupler 162 is operable to provide feedback from the power amplifier 52 to the power regulator 54.

In operation, the power amplifier 152 receives a radio frequency input signal 164 and generates a radio frequency output signal 166 based on the input signal 164. The output signal 166 is provided to the antenna 160 for transmission over the wireless interface. The power amplifier 152 operates based on a regulated power supply signal 170 generated by the power regulator 154.

In addition, the power amplifier 152 receives a bias signal 172 from the power regulator 154. The bias signal 172 may be provided based on a look-up table or other suitable means in order to optimize the efficiency of the power amplifier 152 based on operating conditions.

The power regulator 154 receives a power control signal 174, the input voltage 176 supplied by the power source 156, and a feedback signal 178 from the directional coupler 162. Based on the power control signal 174 and the feedback signal 178, the power regulator 154 generates the regulated power supply signal 170 for the power amplifier 152 from the input voltage 176. According to one embodiment, the power regulator 154 optimizes the efficiency of the power amplifier 152 over a full range of output power levels for the output signal 166 by providing precise closed-loop output power control through the use of the feedback signal 178.

Figure 5A:
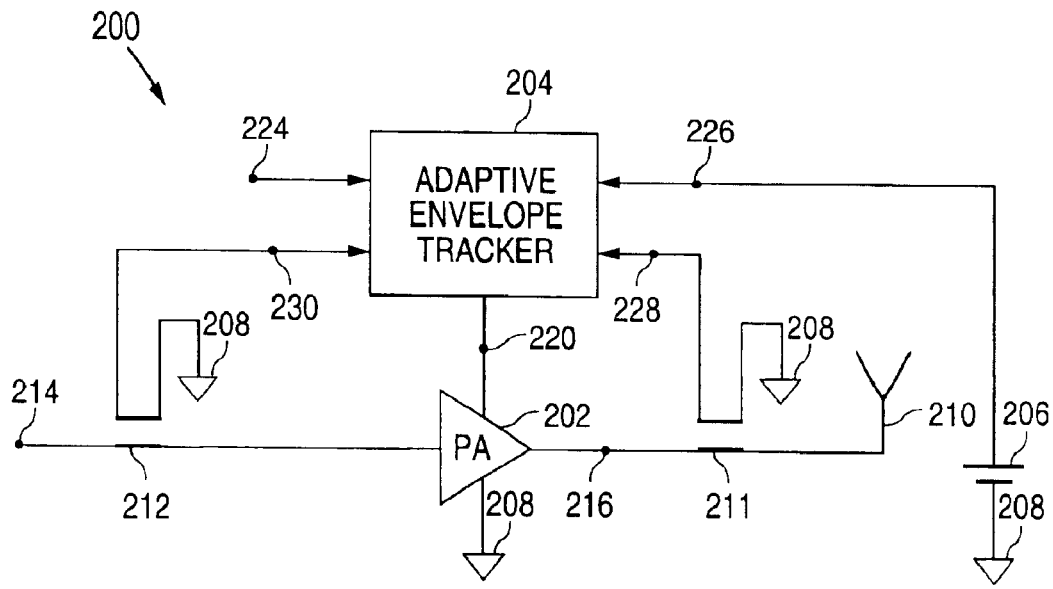
FIG. 5A is a block diagram illustrating the transmitter of FIG. 1 in accordance with a fourth embodiment of the present invention.

FIG. 5A is a block diagram illustrating a transmitter 200 in accordance with one embodiment of the present invention. The transmitter 200 may be used as the transmitter 26 in the wireless device 12 of the communication system 10; however, it will be understood that the transmitter 200 may be implemented in any suitable component or system other than the communication system without departing from the scope of the present invention.

The transmitter 200 comprises a power amplifier 202, a power regulator 204, and a power source 206. The power regulator 204 is coupled between the power source 206 and the power amplifier 202. The power amplifier 202 and the power source 206 are also coupled to ground 208.

The power amplifier 202 comprises a radio frequency power amplifier and is operable to generate a radio frequency signal that includes data modulated onto a carrier for transmission over a wireless interface, such as the wireless interface 22. According to one embodiment, the power amplifier 52 comprises a Class C, E or F amplifier. However, it will be understood that the power amplifier 52 may comprise any suitable type of power amplifier without departing from the scope of the present invention.

The power regulator 204 comprises an adaptive envelope tracker and is operable to receive a specified voltage from the power source 206 and to provide a regulated power supply to the power amplifier 202 based on the voltage received from the power source 206.

According to one embodiment, the power source 206 comprises a battery operable to provide a voltage of between 2.7 and 5.5 volts. However, it will be understood that the power source 206 may provide any suitable voltage without departing from the scope of the present invention. The ground 208 is operable to provide any suitable potential less than the power source 206. According to one embodiment, the ground 208 is operable to provide a potential of approximately 0 volts.

The transmitter 200 also comprises an antenna 210 coupled to the power amplifier 202 and first and second directional couplers 211 and 212. The antenna 210 is operable to receive the radio frequency signal generated by the power amplifier 202 and to transmit the signal over the wireless interface. The directional coupler 211 is operable to provide feedback from the power amplifier 52 to the power regulator 54, while the directional coupler 212 is operable to provide couple an input signal for the power amplifier 52 to the power regulator 54.

In operation, the power amplifier 202 receives a radio frequency input signal 214 and generates a radio frequency output signal 216 based on the input signal 214. The output signal 216 is provided to the antenna 210 for transmission over the wireless interface. The power amplifier 202 operates based on a regulated power supply signal 220 generated by the power regulator 204.

The power regulator 204 receives a power control signal 224, the input voltage 226 supplied by the power source 206, a feedback signal 228 from the directional coupler 211, and an amplifier input signal 230 from the directional coupler 212. Based on the power control signal 224, the feedback signal 228, and the amplifier input signal 230, the power regulator 204 generates the regulated power supply signal 220 for the power amplifier 202 from the input voltage 226. According to one embodiment, the power regulator 204 optimizes the efficiency of the power amplifier 202 over a full range of output power levels for the output signal 216 by tracking both low frequency, including DC, and high frequency, up to at least 5 MHz, input signals 214. According to one embodiment, the high frequency tracked may comprise about 1 MHz to about 5 MHz.

Figure 5B:
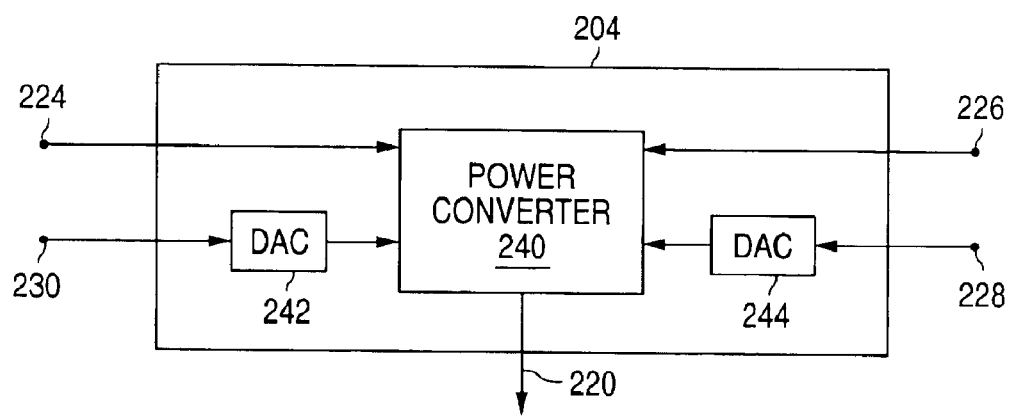
FIG. 5B is a block diagram illustrating the adaptive envelope tracker of FIG. 5A in accordance with one embodiment of the present invention.

FIG. 5B is a block diagram illustrating the adaptive envelope tracker 204 in accordance with one embodiment of the present invention. According to this embodiment, the adaptive envelope tracker 204 is operable to receive the power control signal 224 and the input voltage 226 supplied by the power source 206 and is also operable to receive digital signals for the feedback signal 228 the amplifier input signal 230.

The adaptive envelope tracker 204 comprises a power converter 240, a first digital-to-analog converter (DAC) 242, and a second digital-to-analog converter 244. The first digital-to-analog converter 242 is operable to receive the amplifier input signal 230 and to provide an analog amplifier input signal to the power converter 240. The second digital-to-analog converter 244 is operable to receive the feedback signal 228 and to provide an analog feedback signal to the power converter 240.

Using the input voltage 226, the power converter 240 is operable to generate the regulated power supply voltage 220 for the power amplifier 202 based on the power control signal 224, the analog feedback signal, and the analog amplifier input signal.

Figure 6:
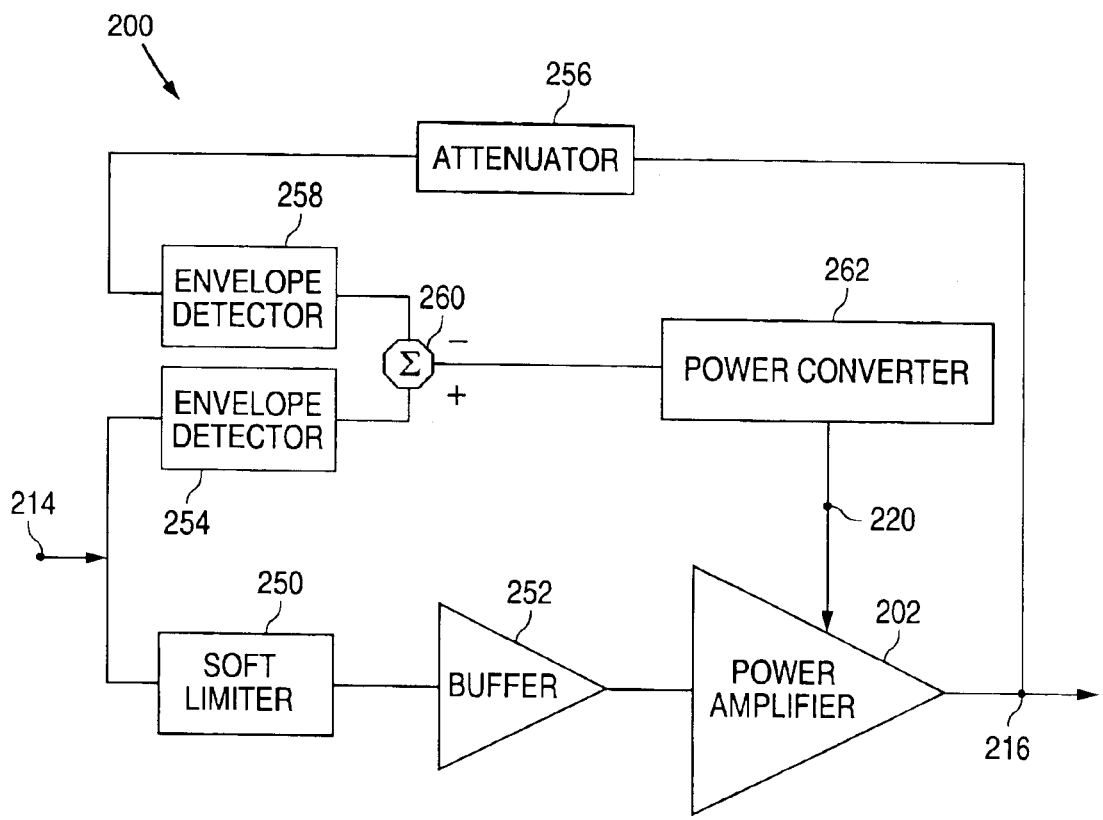
FIG. 6 is a block diagram illustrating details of the transmitter of FIG. 5 in accordance with one embodiment of the present invention.

FIG. 6 is a block diagram illustrating details of the transmitter 200 in accordance with one embodiment of the present invention. According to this embodiment, the transmitter 200 comprises a soft limiter 250, a buffer 252, a first envelope detector 254, an attenuator 256, a second envelope detector 258, a differencing node 260, and a power converter 262, in addition to the power amplifier 202.

The soft limiter 250 is operable to remove amplitude information from the input signal 214 and to provide the phase information to the buffer 252. The buffer 252 is operable to drive the power amplifier 202 with the phase information from the soft limiter 250.

The first envelope detector 254 is operable to remove the phase information from the input signal 214 and to provide the amplitude information to the differencing node 260. The attenuator 256 is operable to receive the output signal 216 and to attenuate the output signal 216 for the second envelope detector 258.

The second envelope detector 258 is operable to receive the attenuated output signal from the attenuator 256, to remove the phase information from the attenuated output signal and to provide the amplitude information to the differencing node 260.

The differencing node 260 is operable to compare the signals from the envelope detectors 254 and 256, which is essentially a comparison of the input signal 214 to the output signal 216, and to provide the difference to the power converter 262.

The power converter 262 is operable to receive the difference signal from the differencing node 260 and to adjust the regulated power supply signal 220 based on the difference signal in order to optimize the efficiency of the power amplifier 202. According to one embodiment, the power converter 262 comprises at least a 3 dB peak-to-average ratio and at least 5 MHz envelope tracking bandwidth.

Figure 7:
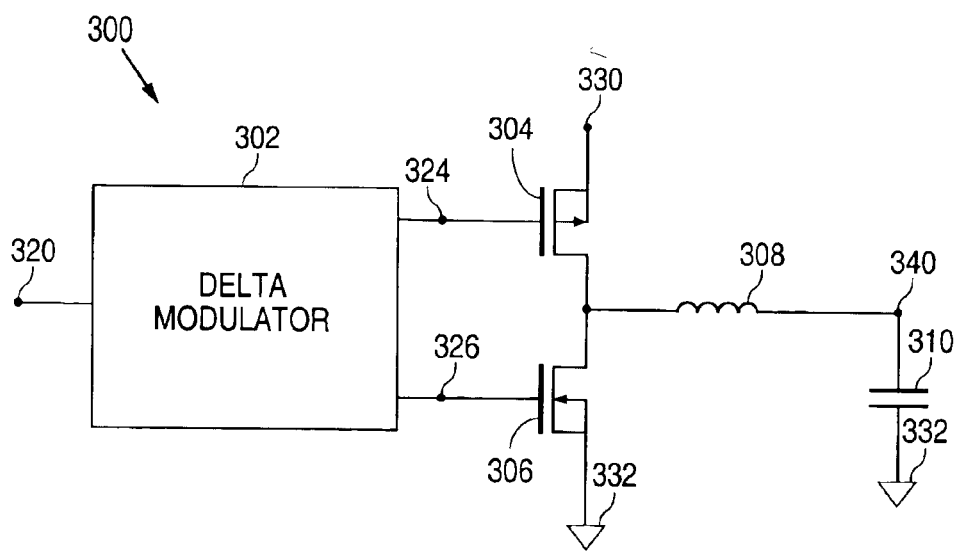
FIG. 7 is a block diagram illustrating the power regulator of FIG. 1 in accordance with a first embodiment of the present invention.

FIG. 7 is a block diagram illustrating a power regulator 300 in accordance with one embodiment of the present invention. The power regulator 300 may be used as the power regulator 32 in the wireless device 12 of the communication system 10; however, it will be understood that the power regulator 300 may be implemented in any suitable component or system other than the communication system 10 without departing from the scope of the present invention.

The power regulator 300 comprises a delta modulator 302, a first transistor 304, a second transistor 306, an inductor 308, and a capacitor 310. The delta modulator 302 is operable to receive a clock signal 320 and to generate a first output signal 324 and a second output signal 326 based on the clock signal 320. The clock signal 320 may comprise a variable switching frequency signal of at least 50 MHz or other suitable clock signal.

The first transistor 304 comprises a p-channel transistor, and the second transistor 306 comprises an n-channel transistor. The first transistor 304 has a source coupled to a power source 330, a drain coupled to a drain of the second transistor 306 and to the inductor 308, and a gate coupled to the delta modulator 302 and operable to receive the first output signal 324. The second transistor 306 has a source coupled to ground 332, a drain coupled to the drain of the first transistor 304 and to the inductor 308, and a gate coupled to the delta modulator 302 and operable to receive the second output signal 326.

The inductor 308 is coupled to the capacitor 310, which is coupled to ground 332. It will be understood that the inductor 308 and the capacitor 310 may comprise external components to the power regulator 300 without departing from the scope of the present invention.

In operation, the delta modulator 302 receives the clock signal 320 and generates the first and second output signals 324 and 326. The first output signal 324 is provided to the gate of the first transistor 304, and the second output signal 326 is provided to the gate of the second transistor 306. The signal at the drains of the transistors 304 and 306 is provided to the inductor and the capacitor 310. A regulated power supply signal 340 is generated by the power regulator 300 between the inductor 308 and the capacitor 310.

Figure 8:
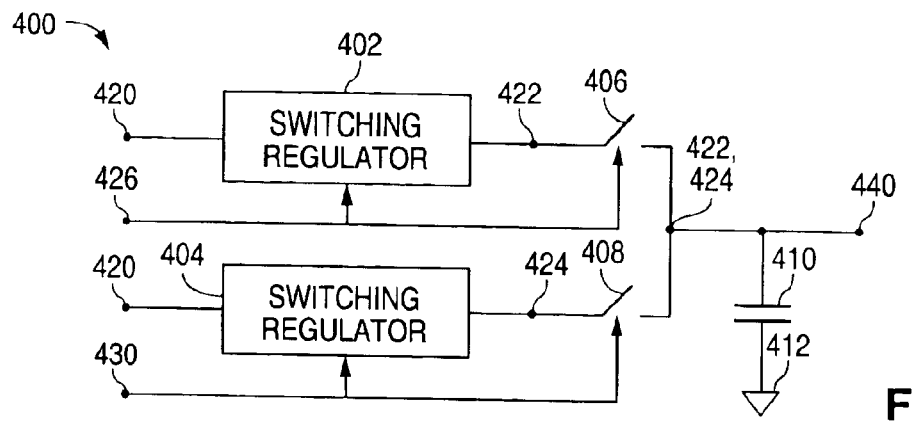
FIG. 8 is a block diagram illustrating the power regulator of FIG. 1 in accordance with a second embodiment of the present invention.

FIG. 8 is a block diagram illustrating a power regulator 400 in accordance with one embodiment of the present invention. The power regulator 400 may be used as the power regulator 32 in the wireless device 12 of the communication system 10; however, it will be understood that the power regulator 400 may be implemented in any suitable component or system other than the communication system 10 without departing from the scope of the present invention.

The power regulator 400 comprises a first switching regulator 402, a second switching regulator 404, a first switch 406, a second switch 408, and a capacitor 410 which is coupled to ground 412. The switching regulators 402 and 404 may comprise pulse-width-modulating buck enable devices or other suitable switching regulators.

The first and second switching regulators 402 and 404 are operable to receive a switching signal 420 and to generate first and second output signals 422 and 424, respectively. According to one embodiment, the switching signal 420 comprises a 1 MHz switching signal; however, it will be understood that the switching signal 420 may comprise any other suitable switching signal without departing from the scope of the present invention.

The first switching regulator 402 and the first switch 406 are operable to receive a select signal 426, which is operable to select the first switching regulator 402 by closing the first switch 406. In this situation, the first output signal 422 is provided by the power regulator 400 as the regulated power supply signal 440.

The second switching regulator 404 and the second switch 408 are operable to receive a select signal 430, which is operable to select the second switching regulator 404 by closing the second switch 408. In this situation, the second output signal 424 is provided by the power regulator 400 as the regulated power supply signal 440.

Figure 9:
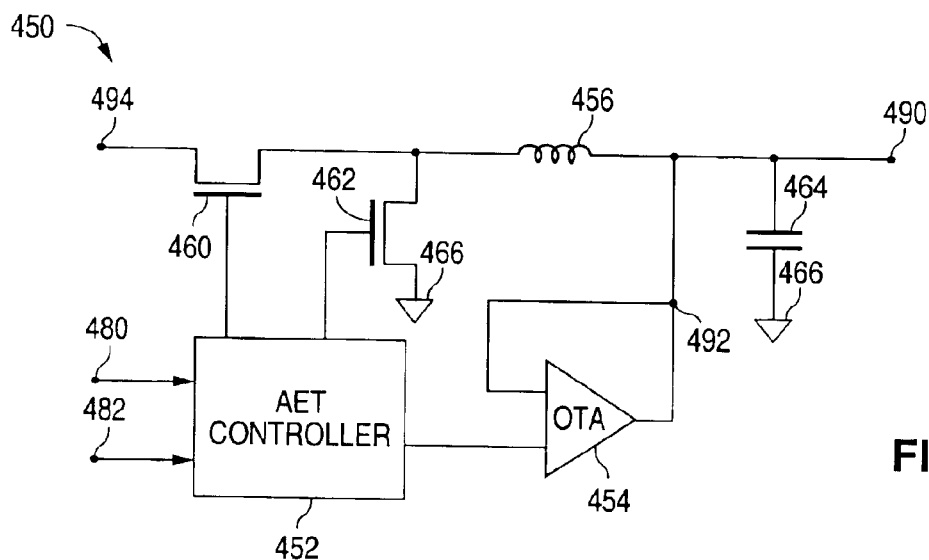
FIG. 9 is a block diagram illustrating the power regulator of FIG. 1 in accordance with a third embodiment of the present invention.

FIG. 9 is a block diagram illustrating a power regulator 450 in accordance with one embodiment of the present invention. The power regulator 450 may be used as the power regulator 32 in the wireless device 12 of the communication system 10; however, it will be understood that the power regulator 450 may be implemented in any suitable component or system other than the communication system 10 without departing from the scope of the present invention.

The power regulator 450 comprises an adaptive envelope tracking (AET) controller 452, an operational transconductance amplifier (OTA) 454, a synchronous buck 456, a first transistor 460, a second transistor 462, and a capacitor 464 which is coupled to ground 466.

The AET controller 452 is operable to receive a power control signal 480 and an envelope signal 482 and to generate an output signal for the OTA 454, in addition to signals for the transistors 460 and 462. The OTA 454 is operable to receive the output signal from the AET controller 452 and to generate a regulated power supply signal 490 based on the output signal from the AET controller 452 and a feedback signal 492.

In operation, the AET controller 452 receives the power control signal 480 and the envelope signal 482 and generates signals for the first transistor 460 and the second transistor 462 and an output signal for the OTA 454. The first and second transistors 460 and 462 receive the signals from the AET controller 452 and, based on those signals and a power source signal 494, generate a signal at the synchronous buck 456. The OTA 454 generates the regulated power supply signal 490 based on the output signal from the AET controller 452 and the feedback signal 492.

Figure 10:
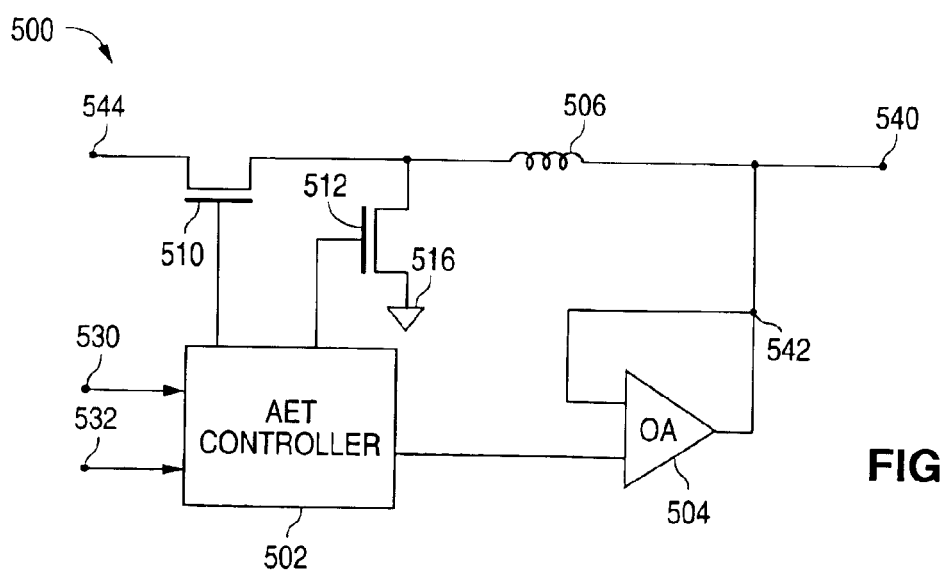
FIG. 10 is a block diagram illustrating the power regulator of FIG. 1 in accordance with a fourth embodiment of the present invention.

FIG. 10 is a block diagram illustrating a power regulator 500 in accordance with one embodiment of the present invention. The power regulator 500 may be used as the power regulator 32 in the wireless device 12 of the communication system 10; however, it will be understood that the power regulator 500 may be implemented in any suitable component or system other than the communication system 10 without departing from the scope of the present invention.

The power regulator 500 comprises an adaptive envelope tracking (AET) controller 502, an operational amplifier (OA) 504, a synchronous buck 506, a first transistor 510, and a second transistor 512 which is coupled to ground 516.

The AET controller 502 is operable to receive a power control signal 530 and an envelope signal 532 and to generate an output signal for the operational amplifier 504, in addition to signals for the transistors 510 and 512. The operational amplifier 504 is operable to receive the output signal from the AET controller 502 and to generate a regulated power supply signal 540 based on the output signal from the AET controller 502 and a feedback signal 542.

In operation, the AET controller 502 receives the power control signal 530 and the envelope signal 532 and generates signals for the first transistor 510 and the second transistor 512 and an output signal for the operational amplifier 504. The first and second transistors 510 and 512 receive the signals from the AET controller 502 and, based on those signals and a power source signal 544, generate a signal at the synchronous buck 506. The operational amplifier 504 generates the regulated power supply signal 540 based on the output signal from the AET controller 502 and the feedback signal 542. In this way, low frequency responses may be provided by a switching regulator, while high frequency responses are provided by a linear amplifier to optimize efficiency over a full range of output power levels.

Figure 11:
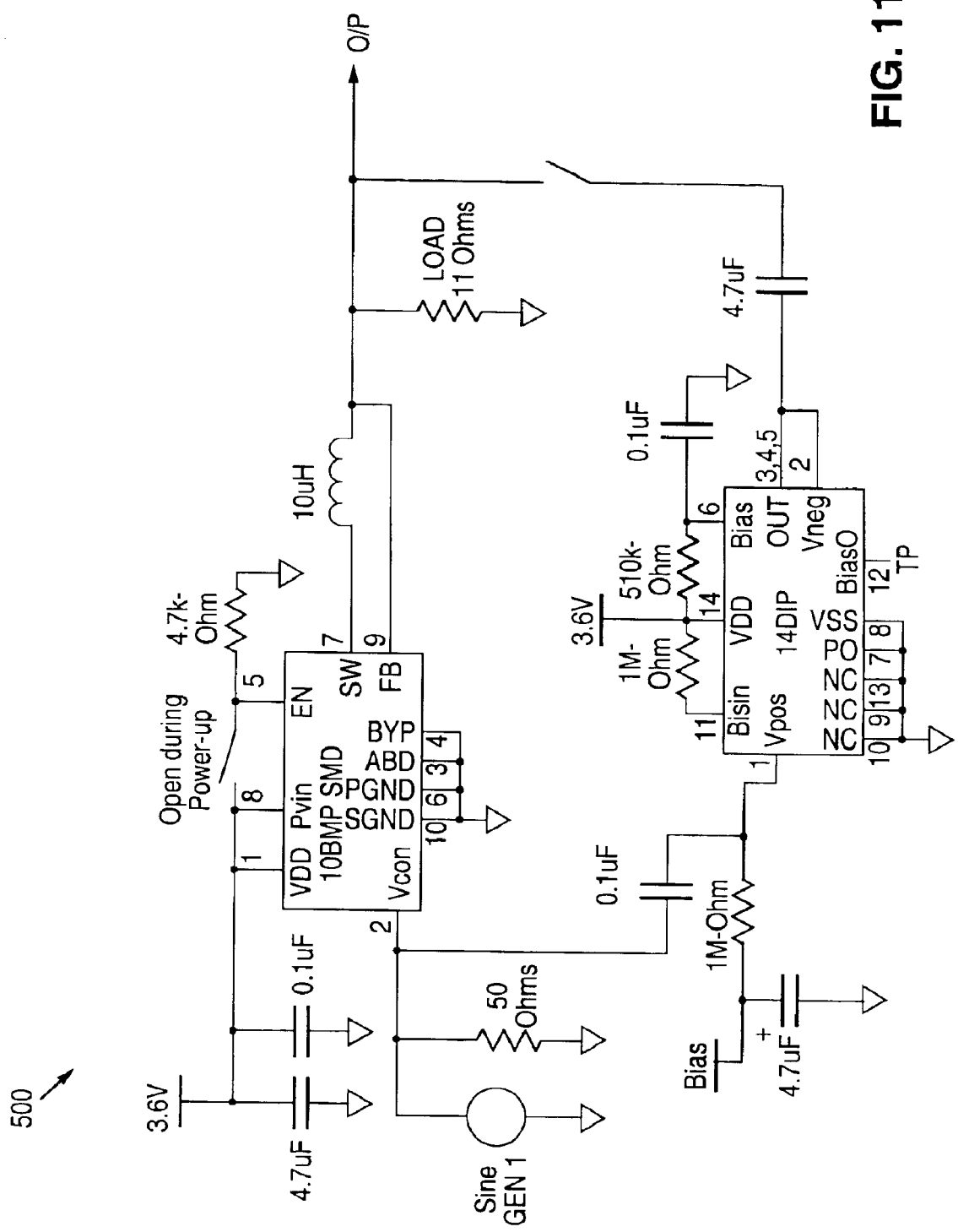
FIG. 11 schematic diagram illustrating the power regulator of FIG. 10 in accordance with a specific embodiment of the present invention.

FIG. 11 is a schematic diagram illustrating the power regulator 500 in accordance with a specific embodiment of the present invention. For this embodiment, the power regulator 500 comprises a CMOS-AB amplifier with an LM2706 variable DC-DC converter. The amplifier output is AC coupled and switched in or out to the output of the LM2706.

The supply voltage is approximately 3.6 volts and the amplifier input bias voltage is approximately 3.2 volts. The input sine wave into the Vcon of the LM2706 is approximately 300 millivolts peak-to-peak with a 1.0 volt offset. Using this specific embodiment, the DC input swing is approximately 0.85 to 1.15 volts, and the output voltage swing is approximately 1.94 to 2.46 volts, or about 525 millivolts peak-to-peak. For this embodiment, the LM2706 is able to track with Vcon up to frequencies as high as 100 kHz. It will be understood that the operating conditions may be suitably adjusted without departing from the scope of the present invention.

Although the present invention has been described with several embodiments, various changes and modifications may be suggested to one skilled in the art. It is intended that the present invention encompass such changes and modifications as fall within the scope of the appended claims.

What is claimed is:

1. A method for providing power management in a radio frequency power amplifier using adaptive envelope tracking, comprising:

receiving an input voltage;

receiving a power control signal;

receiving a feedback signal;

receiving an amplifier input signal; and generating from the input voltage a regulated power supply signal using the power control signal, the feedback signal, and the amplifier input signal.

2. The method of claim 1, further comprising providing the regulated power supply signal to a power amplifier.

3. The method of claim 2, further comprising:

receiving the regulated power supply signal at the power amplifier;

receiving a radio frequency input signal at the power amplifier; and generating at the power amplifier a radio frequency output signal based on the radio frequency input signal.

4. The method of claim 3, further comprising providing the radio frequency output signal to an antenna for transmission over a wireless interface.

5. The method of claim 3, receiving a feedback signal comprising receiving the feedback signal from a directional coupler operable to provide the radio frequency output signal as the feedback signal.

6. The method of claim 3, receiving an amplifier input signal comprising receiving the amplifier input signal from a directional coupler operable to provide the radio frequency input signal as the amplifier input signal.

7. The method of claim 1, receiving an input voltage comprising receiving the input voltage from a power source, the power source comprising a battery.

8. The method of claim 1, the amplifier input signal comprising a signal of about 1 MHz to about 5 MHz.

9. A method for providing power management in a radio frequency power amplifier using adaptive envelope tracking, comprising:
   receiving an input voltage;
   receiving a power control signal;
   receiving a digital feedback signal;
   receiving a digital amplifier input signal;
   converting the digital amplifier input signal into an analog amplifier input signal;
   converting the digital feedback signal into an analog feedback signal; and
   generating from the input voltage a regulated power supply signal using the power control signal, the analog feedback signal, and the analog amplifier input signal.

10. The method of claim 9, further comprising:
    providing the regulated power supply signal to a power amplifier;
    receiving the regulated power supply signal at the power amplifier;
    receiving a radio frequency input signal at the power amplifier; and
    generating at the power amplifier a radio frequency output signal based on the radio frequency input signal.

11. The method of claim 9, receiving an input voltage comprising receiving the input voltage from a power source, the power source comprising a battery.

12. The method of claim 9, the analog amplifier input signal comprising a signal of about 1 MHz to about 5 MHz.

13. A system for providing power management in a radio frequency power amplifier using adaptive envelope tracking, comprising:
    a power amplifier operable to generate a radio frequency output signal based on a radio frequency input signal; and
    a power converter coupled to the power amplifier, the power converter operable to receive an input voltage, a power control signal, a feedback signal and an amplifier input signal and to generate from the input voltage a regulated power supply signal for the power amplifier using the power control signal, the feedback signal, and the amplifier input signal.

14. The system of claim 13, further comprising a directional coupler operable to provide the radio frequency output signal from the power amplifier to the power converter as the feedback signal.

15. The system of claim 13, further comprising a directional coupler operable to provide the radio frequency input signal to the power converter as the amplifier input signal.

16. The system of claim 13, further comprising a power source.

17. The system of claim 16, the power source comprising a battery.

18. The system of claim 13, further comprising an antenna coupled to the power amplifier, the antenna operable to receive the radio frequency output signal from the power amplifier and to transmit the radio frequency output signal over a wireless interface.

19. The system of claim 13, further comprising a soft limiter coupled to the power amplifier, the soft limiter operable to receive an input signal, to remove amplitude information from the input signal and to provide phase information from the input signal to the power amplifier.

20. The system of claim 19, further comprising:
    a differencing node coupled to the power converter;
    a first envelope detector coupled to the differencing node, the first envelope detector operable to receive the input signal, to remove phase information from the input signal and to provide amplitude information from the input signal to the differencing node as the amplifier input signal;
    an attenuator coupled to the power amplifier, the attenuator operable to receive the radio frequency output signal and to attenuate the radio frequency output signal;
    a second envelope detector coupled to the differencing node and to the attenuator, the second envelope detector operable to receive the attenuated output signal, to remove phase information from the attenuated output signal and to provide amplitude information from the attenuated output signal to the differencing node as the feedback signal; and
    the differencing node operable to determine a difference between the amplifier input signal and the feedback signal and to provide the difference to the power converter.

21. A system for providing power management in a radio frequency power amplifier using adaptive envelope tracking, comprising:
    a power amplifier operable to generate a radio frequency output signal based on a radio frequency input signal; and
    a power regulator coupled to the power amplifier, the power regulator operable to receive a power source signal, a power control signal, and an envelope signal and to generate from the power source signal a regulated power supply signal for the power amplifier based on the power control signal and the envelope signal.

22. The system of claim 21, the power regulator comprising an adaptive envelope tracking (AET) controller operable to receive the power control signal and the envelope signal and to generate first, second and third output signals.

23. The system of claim 22, the power regulator further comprising an operational amplifier coupled to the AET controller, the operational amplifier operable to receive the first output signal and a feedback signal and to generate the regulated power supply signal based on the first output signal and the feedback signal.

24. The system of claim 23, the power regulator further comprising:
    a first transistor coupled to the AET controller, the first transistor operable to receive the second output signal and the power source signal;
    a second transistor coupled to the AET controller and to the first transistor, the second transistor operable to receive the third output signal, the first and second transistors operable to generate a buck signal; and
    a synchronous buck coupled to the first and second transistors and to the operational amplifier, the synchronous buck operable to receive the buck signal.

25. The system of claim 21, further comprising an antenna coupled to the power amplifier, the antenna operable to receive the radio frequency output signal from the power amplifier and to transmit the radio frequency output signal over a wireless interface.

* * * * *

UNITED STATES PATENT AND TRADEMARK OFFICE
CERTIFICATE OF CORRECTION

PATENT NO. : 6,914,487 B1
DATED : July 5, 2005
INVENTOR(S) : James T. Doyle et al.

It is certified that error appears in the above-identified patent and that said Letters Patent is hereby corrected as shown below:

<u>Column 4,</u>
Line 2, delete "riot" and replace with -- not --;

<u>Column 5,</u>
Line 17, insert -- 10 -- after "system";

<u>Column 6,</u>
Line 27, insert -- 10 -- after "system";

<u>Column 8,</u>
Line 14, insert -- 10 -- after "system";

<u>Column 13,</u>
Line 56, insert -- coupled to the power converter, the power source operable to provide the input voltage -- after "source".

Signed and Sealed this

Twenty-third Day of May, 2006

JON W. DUDAS
*Director of the United States Patent and Trademark Office*